United States Patent [19]
Rowe

[11] Patent Number: 5,506,032
[45] Date of Patent: Apr. 9, 1996

[54] STRUCTURAL PANEL HAVING INTEGRAL HEAT PIPE NETWORK

[75] Inventor: Nigel C. Rowe, Freehold, N.J.

[73] Assignee: Martin Marietta Corporation, East Windsor, N.J.

[21] Appl. No.: 225,948

[22] Filed: Apr. 8, 1994

[51] Int. Cl.$^6$ .................... B32B 3/20; E04C 2/34
[52] U.S. Cl. .............. 428/178; 428/72; 428/73; 428/116; 428/120; 428/188; 428/212; 428/304.4; 428/913; 52/793.1
[58] Field of Search .................... 428/178, 188, 428/72, 73, 116, 119, 120, 212, 304.4, 913; 52/806, 808

[56] References Cited

U.S. PATENT DOCUMENTS

| | | | |
|---|---|---|---|
| 3,749,156 | 7/1973 | Fletcher et al. | 165/32 |
| 4,162,701 | 7/1979 | Ollendorf | 165/32 |
| 5,215,824 | 6/1993 | Munro et al. | 428/473.5 |
| 5,366,787 | 11/1994 | Yasui et al. | 428/174 |

FOREIGN PATENT DOCUMENTS 2452078  10/1980  France .

OTHER PUBLICATIONS

Drawing 3272727, "Panel Assembly, North, C–Band, ANIK–E," Sheets 1–3 of 3, Rev. D, Dec. 27, 1988.
Drawing 20004292, "SE/SW Panel Assembly, C3/C4," Sheet 2 of 5, Rev. F, Apr. 25, 1991.
Drawing 20003606, "Transponder Panel Assembly (South)," Sheets 2, 3, 9 and 10 of 14, Rev. N, Jul. 22, 1992.
"Anik E Spacecraft System Summary; Bus Subsystems," vol. 2, Sep. 12, 1990, pp. vii, xii, xiii, 7–8, 7–12, 7–16, and 7–19.
"Anik E Operations Manual," vol. 4, Mar. 18, 1991, pp. iv–vi, C–31 and C–32.
Section 7.3 "Transponder Panel (Heat Pipe Layout)"—10 sheets.
Drawing 2633857.2, "North Transponder Panel Interface," Sheet 2, May 6, 1988.

*Primary Examiner*—Donald J. Loney
*Attorney, Agent, or Firm*—Clement A. Berard, Jr.

[57] ABSTRACT

A structural panel has thin inner and outer facesheets bonded to a lightweight structural interior core of a honeycomb material. The inner facesheet is for receiving equipment that generates heat to be dissipated and the outer facesheet is adapted to dissipate such heat, such as by radiation. A plurality of closely-spaced heat pipes interior to the panel are thermally coupled to each other and to the inner facesheet for receiving heat from the equipment mounted thereon. A plurality of spaced-apart heat pipes interior to the panel are at about right angles to the closely-spaced heat pipes and are thermally coupled to the outer facesheet and to the closely-spaced heat pipes proximate their intersections therewith. Heat to be dissipated flows along short, direct and efficient paths from the equipment to the inner facesheet, to the closely-spaced heat pipes, to the spaced-apart heat pipes and to the outer facesheet from whence it is dissipated.

19 Claims, 4 Drawing Sheets great care in determining: the size of the thermal radiator, but in transporting

STRUCTURAL PANEL HAVING INTEGRAL HEAT PIPE NETWORK

The present invention relates to structural panels, and, in particular, to such panels including elongated high thermal conductivity devices therein.

Structural panels for mounting electronic equipment must not only provide physical support for such equipment but must also provide for removal of heat generated by such equipment. Conventionally, greater heat loads can be accommodated by making the panel more massive or by providing liquid coolant flow passages to increase its heat transport capability. In certain environments, however, the additional weight of a more massive panel or of liquid cooling systems are not tolerable. This is especially the case in a spacecraft where light weight is critical and where heat dissipation ultimately depends upon radiative heat transfer to space.

Requirements for increased heat rejection translate directly into requirements for greater surface area for the thermal radiators. The practical difficulty arises not in determining the size of the thermal radiator, but in transporting the heat to be dissipated from a relatively concentrated or small area where it is generated (e.g., near the base of a piece of electronic equipment) to the relatively large area of the thermal radiator surface. Moreover, this must be accomplished in a way that minimizes both the temperature difference over the area of the radiator surface, thereby increasing the radiative efficiency, and the temperature difference between the radiator surface and the electronic equipment. In addition, it is often necessary or desirable to maintain various electronic equipments at about the same temperature. Since all these ends are accomplished principally by heat conduction, it is necessary to minimize the weight and optimize the efficiency of the heat conduction means.

Equipment panels for prior art spacecraft typically include two aluminum facesheets and an aluminum honeycomb core bonded therebetween. Heat generating equipment is mounted on the facesheet interior to the spacecraft (inner facesheet) and heat is radiated to space from the facesheet exterior to the spacecraft (outer facesheet). Prior art panels are known that employ networks of heat pipes either within or without the panels to conduct heat from the equipment to the radiator surface. These networks may include plural, elongated heat pipes called "feeders" laying parallel to and spaced apart from each other against the inner facesheet to each receive heat from an electronic equipment, and conduct it along its length. Such panel may also include one or more additional heat pipes called "headers" that are arrayed parallel to each other against the outer facesheet and in a second direction perpendicular to that of the "feeder" heat pipes for conducting heat from "feeder" to "feeder" and from the "feeders" to the radiator surface. Generally, one or two feeder heat pipes are associated with each item of heat generating equipment. Operation of the prior art panel will be described in relation to the heat flow schematic diagram of FIG. 1 in which heat flow is represented by arrows, the width of which is indicative of the heat flow magnitude. The principal flow of heat energy to be dissipated is from equipment 100 through the inner facesheet (via conductive couplings 102) to its feeder heat pipe 110, then along that feeder heat pipe and outward (via conductive couplings 104) to header heat pipe(s) 120, then along header feed pipe(s) 120, and back toward the inner facesheet (via conductive couplings 112) to feeder heat pipes 114, and from both header and feeder heat pipes to the radiating surface of the outer facesheet. For even distribution of heat across the outer facesheet, feeder heat pipes 114 that have a lesser heat load or no heat load conduct heat away from the header heat pipes 120 via conductive couplings 112. Each of couplings 104 and 112 conduct high heat flows and are a physical mechanical path that has significant thermal resistance, and so generates large and undesirable temperature differences. As a result, significant portions of the heat energy to be dissipated must flow over long thermal paths (through feeder 110 to header 120 and then through header 120 to another feeder 114 and then through that feeder 114) to get to the outer facesheet radiator surface. The prior art arrangement has at least two high resistance thermal couplings 104, 112 in series and each undesirably hinders heat flow and makes it less efficient. Moreover, heat flow in at least one of the couplings is in a direction away from the radiator rather than towards it as is desired. Most of the heat to be radiated flows via a longer, higher resistance, less efficient path (represented by long arrows 124) from feeder heat pipes 110, 110', 114, 114' to the radiator surface. Some of the heat to be radiated flows via a more direct, lower resistance path (represented by short arrows 122) from header heat pipes 120 which are coupled to the outer facesheet. A panel arrangement having fewer high resistance couplings and more direct and therefore more efficient heat flow paths would be desirable.

Accordingly, the present invention comprises at least three elongated first high-heat-conductance elements in closely-spaced side-by-side relationship and at least three other elongated second high-heat-conductance elements in spaced-apart, side-by-side relationship that are angled to intersect with and be thermally coupled to the first elements proximate the intersections. First and second thermally conductive sheets have surfaces that are respectively thermally coupled to the first and second elongated elements along their lengths.

BRIEF DESCRIPTION OF THE DRAWINGS

In FIG. 2, structural panel 10 includes inner facesheet 12, outer facesheet 16, and a honeycomb core 14 bonded therebetween. Facesheets 12 and 16 are planar and spaced apart parallel to each other and constructed of a conductive material such as aluminum or a composite material. Inner facesheet 12 is shown cut away along edge 18A to reveal the internal construction of the panel. Similarly, honeycomb core 14 is shown cut away along edge 18B revealing the inner surface of outer facesheet 16. FIG. 2 shows panel 10 as it would be viewed from the interior of a spacecraft of which it were a part. Within panel 10, a highly thermally conductive header 20 is formed of a plurality of thermally conductive elongated heat pipes 22, 24, 26 which are closely spaced in side-by-side thermally conductive relationship and are thermally bonded along their lengths to the inner surface of inner facesheet 12. A plurality 40 of spreader heat pipes 42, 44, 46, 47, 48 are arranged in spaced-apart relationship and are angled with respect to header heat pipes 20 so as to intersect therewith. Heat pipes 42, 44, 46, 47 and 48 are thermally bonded along their lengths to the inner surface of outer facesheet 16 and are also thermally bonded to each of header heat pipes 22, 24 and 26 proximate to their intersections therewith.

Figure 1:
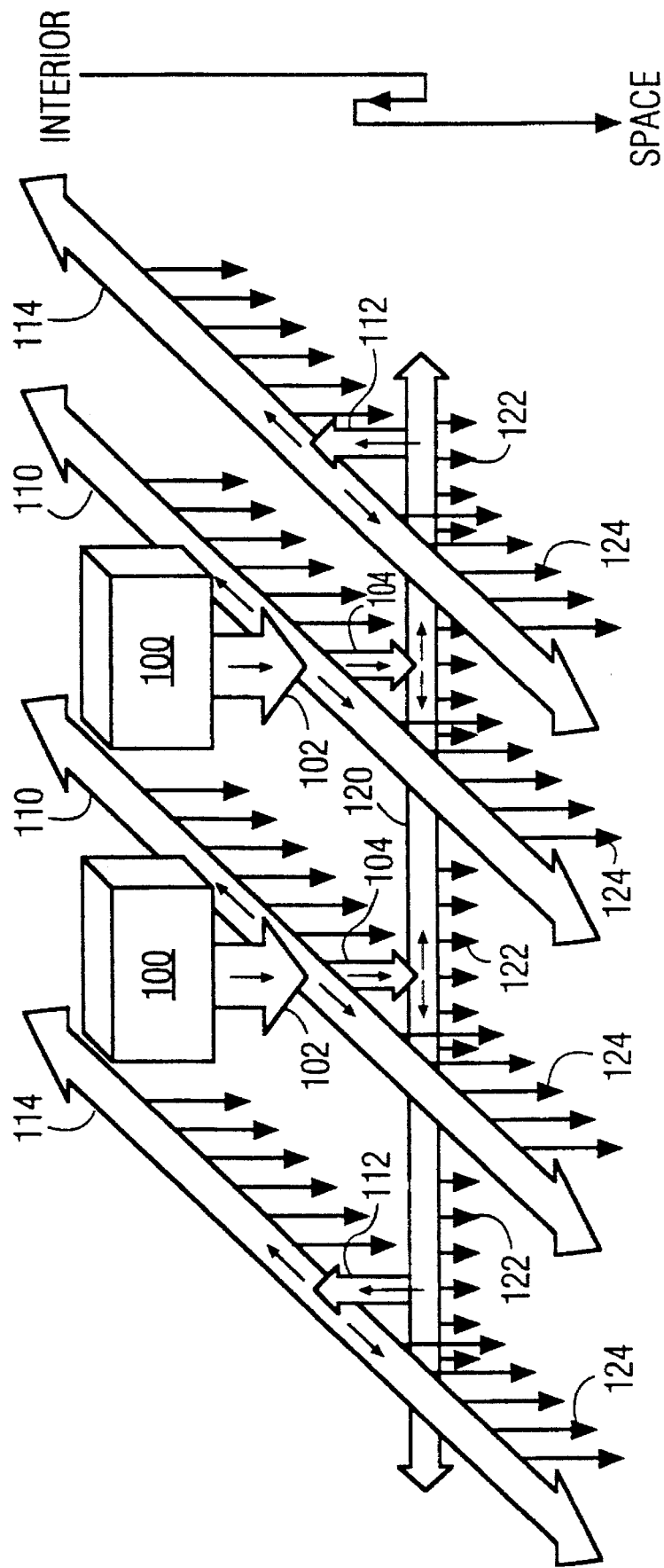
FIG. 1 is a heat flow schematic diagram of a prior art panel.

Electronic equipment is mounted on the face of structural panel 10 which is interior to the spacecraft, i.e., the outer surface of the inner facesheet 12. Heat is generated in that equipment when it is operating as a result of the dissipation of electrical energy therein. Some electronic equipment employed in spacecraft, such as traveling wave tube amplifiers (TWTAs) dissipate relatively large amounts of power and are relatively small in size, whereas other equipments such as an electronic power conditioner for a TWTA or solid state power amplifiers (SSPAs) would generate a moderate amount of power over an equivalent or larger area. On the other hand, other equipment may have either a much larger mounting area or dissipate less power and therefore not be as significant a thermal control problem.

On panel 10, for example, high power equipment 60, 60', 60" are mounted to inner facesheet 12 at locations that are over the location of header heat pipes 20 for providing a short and direct heat flow path from the mounting base of equipment 60, 60', 60" to heat pipes 22, 24, 26 of header 20. Header heat pipes 20 have a very high thermal conductance along their lengths and the heat from equipment 60, 60', 60" is conducted along their length to form an essentially isothermal high heat conductance path. At the intersection of header heat pipes 20 with the spreader heat pipes 42–48, heat from header heat pipes 20 to heat pipes 42–48 at such intersections flows in a direction that is away from the inner facesheet where it is produced and toward the outer facesheet from which it will ultimately be radiated. Heat conducted to spreader heat pipes 42–48 is conducted along their respective lengths, each also tending to become a substantially isothermal heat conductor. This heat is then conducted directly by a short and direct thermal path including the bonding of heat pipes 42–48 to outer facesheet 16, the outer surface of which forms the radiator surface.

Figure 2:
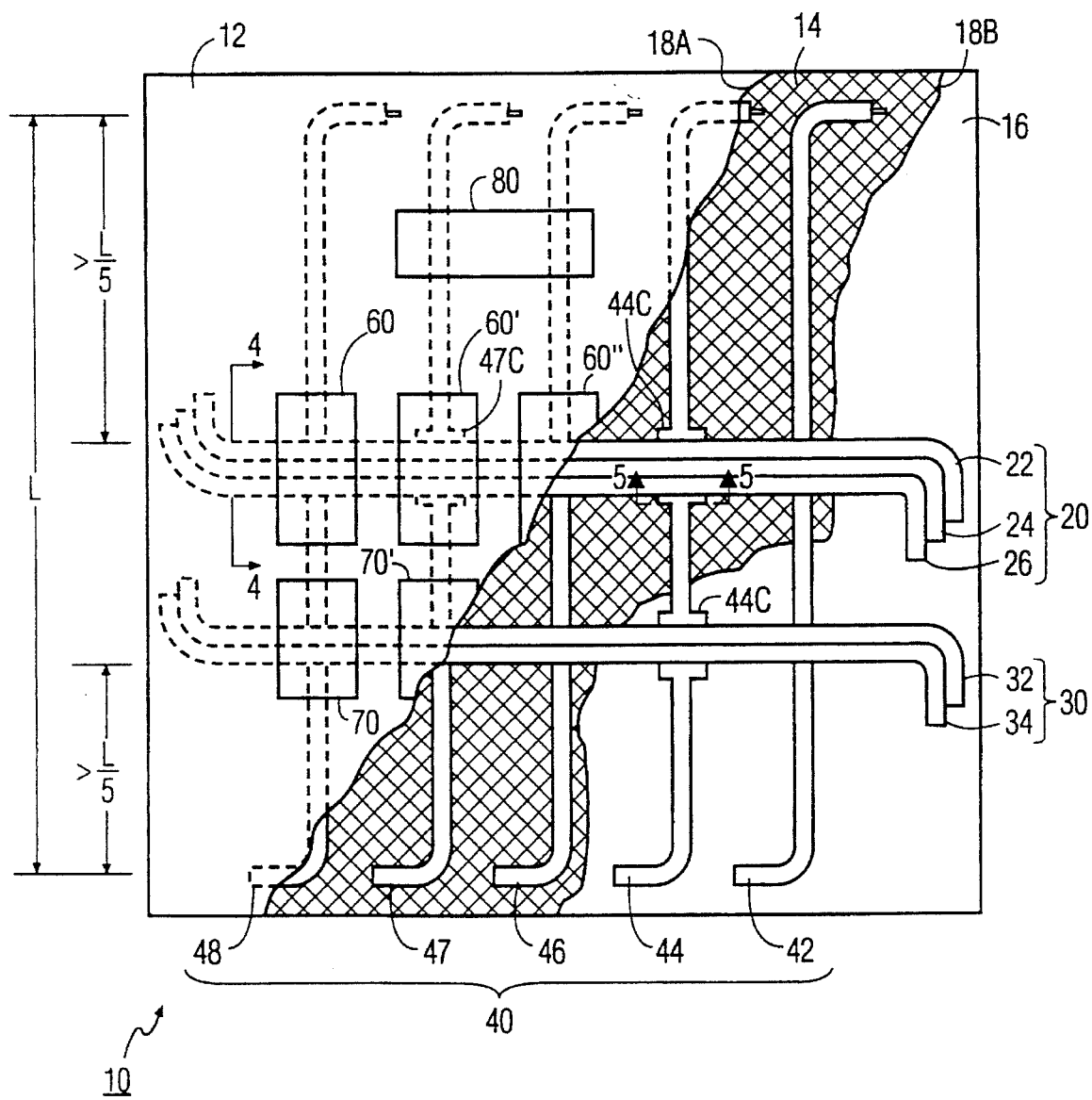
FIG. 2 is a diagram of a panel according to the present invention.
Figure 3:
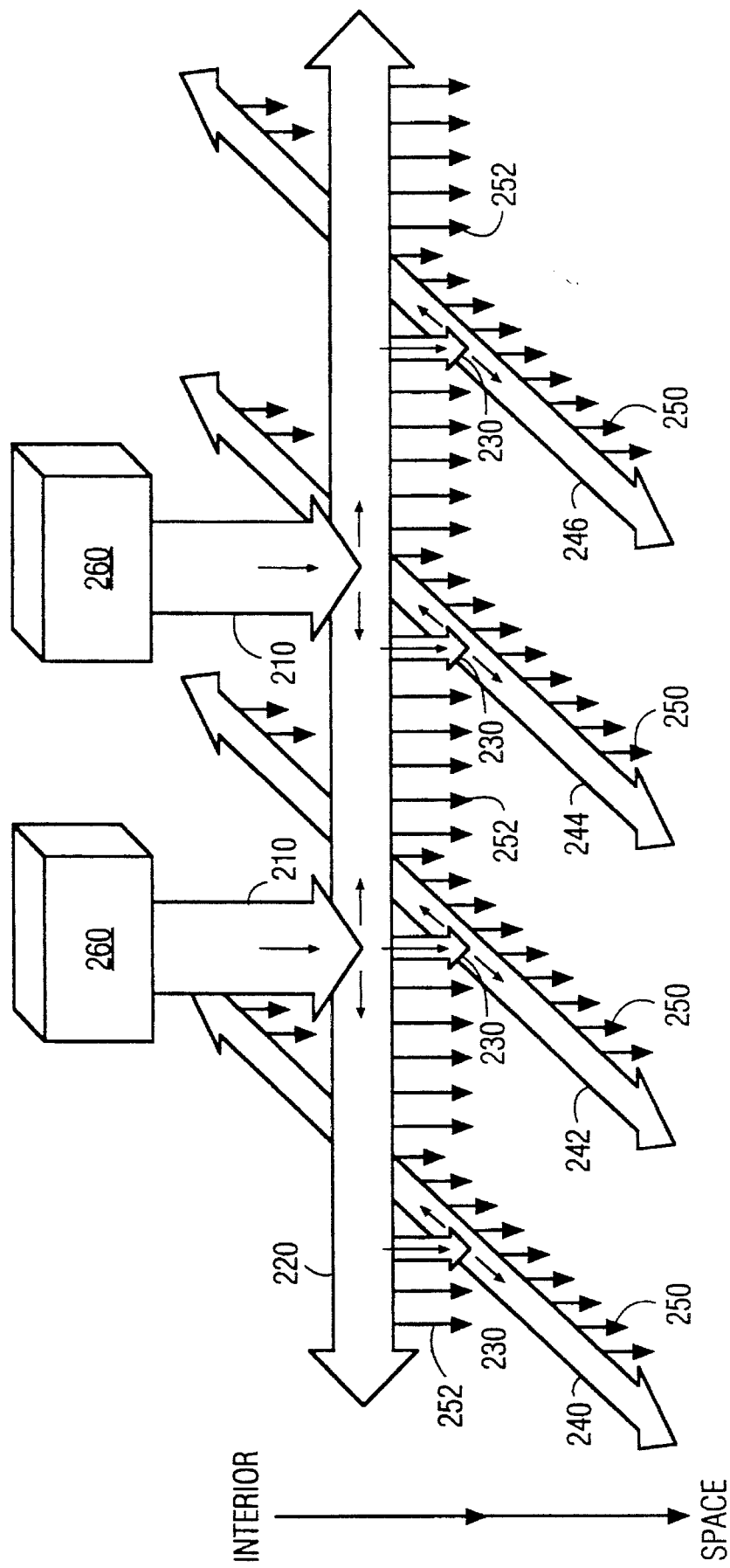
FIG. 3 is a heat flow schematic diagram relating to the arrangement of FIG. 2.

The flow of heat in the panel 10 of FIG. 2 may be understood more readily in relation to the heat flow schematic diagram of FIG. 3. Therein, heat from heat producing devices 260 is coupled to the header heat pipe arrangement 220 through thermal couplings 210 which include the thermally conductive attachment of equipment 260 with the header heat pipes 220 (which is essentially isothermal). The heat then flows, again toward the radiator surface, through thermal couplings 230 which include the thermally conductive bonding of header heat pipes 220 with spreader heat pipes 250 at their respective intersections. Heat then flows in both directions along each of heat pipes 250 and then is passed through outer facesheet 16 and is radiated into space. This radiation of the heat conducted by heat pipes 240, 242, 244 and 246 is via a direct and low resistance path (represented by short, wide arrows 250) through the thermally conductive material of facesheet 16. In addition, some small portion of the heat from header heat pipes 220 flows through the panel 10 and is radiated from the outer surface of facesheet 16 (represented by long arrows 252).

In consequence of the arrangement of header heat pipes 22, 24, 26 and spreader heat pipes 42–48 of FIG. 2 (header 220 and spreaders 240, 242, 244, 246 of FIG. 3), the heat flow is always in the direction away from the heat source and toward the radiating surface by a direct and low resistance path. It is noted that every heat flow path traverses only one coupling 230 between header and spreader heat pipes, in contrast to the prior art panel which has at least two high resistance coupling paths. Moreover, the vast majority of the heat flow paths to the radiator involve the short and direct couplings represented by arrows 250 with a much lesser proportion of the heat flowing via longer but still direct paths represented by arrows 252.

This is in contrast to the longer, higher resistance, less direct, and less efficient, thermal conduction paths found in the prior art panel depicted in the heat flow schematic diagram of FIG. 1. Therein the vast majority of heat to be radiated flows via a longer, higher resistance path represented by the arrows 124 coupling from feeder heat pipes 110 and 114 and to a lesser extent a shorter path to the radiating surface as represented by arrows 122 from heat pipe 120. In addition, it is noted that heat flow in the prior art panel to the feeder pipes not underlying the heat producing equipment, or to those carrying a lesser heat load from the equipment to which they are coupled, receive heat flow from equipments 100 via a path which causes heat to flow in a direction away from the radiating surface, i.e. in a direction opposite to that desired, and to traverse at least two high resistance couplings 104, 112.

Figure 4:
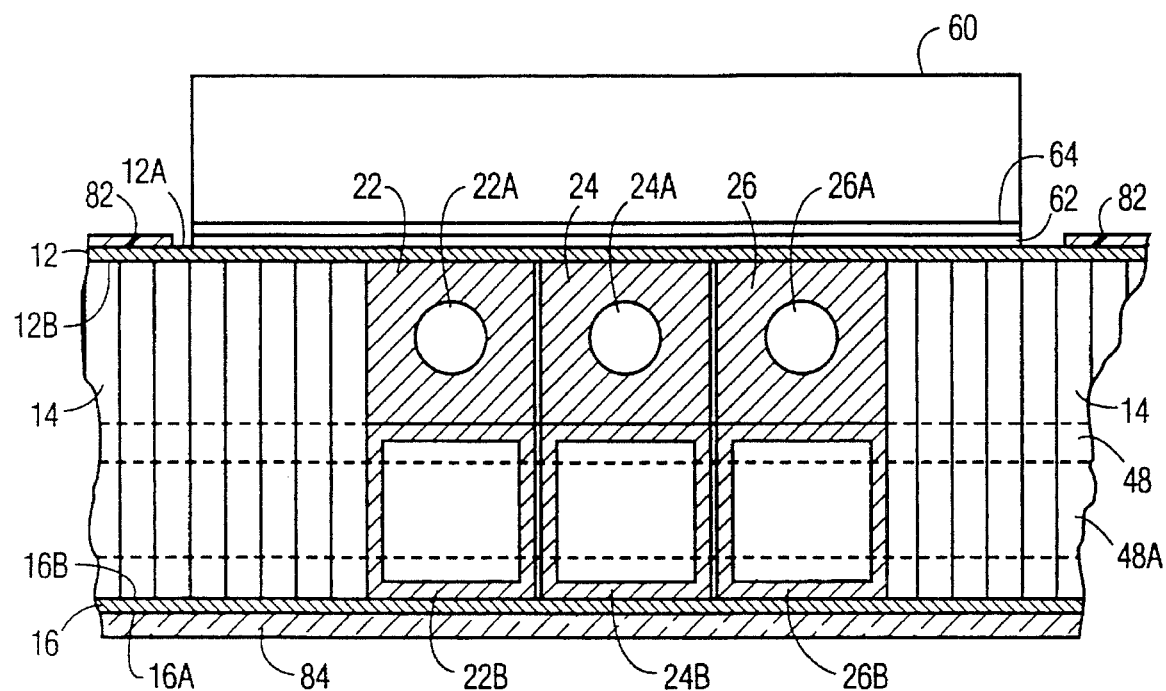
FIGS. 4 and 5 are diagrams of details of the panel of FIG. 2.

The construction of panel 10 of FIG. 2 is further shown in cross-section 4—4 thereof in FIG. 4. Heat pipes 22, 24 and 26 are in side-by-side closely thermally-coupled relationship and are bonded along their lengths to surface 12B of inner facesheet 12. Bores 22A, 24A and 26A of heat pipes 22, 24 and 26 contain the two-phase working fluid described in greater detail below. Spacers 22B, 24B and 26B, constructed of a thermally conductive material such as an aluminum alloy, are bonded along one of their sides to heat pipes 22, 24 and 26, respectively, to each other where they are in side-by-side relationship and to inner surface 16B of outer facesheet 16. Honeycomb core 14 extends between the respective inner surfaces 12B and 16B of the inner and outer facesheets 12, 16 and is bonded at its opposite ends thereto using a reticulation technique well known to those of ordinary skill in the art. Equipment, such as an electronic component 60, is mounted to outer surface 12A of inner facesheet 12. A doubler 62 of a thermally conductive material such as aluminum alloy is interposed between equipment 60 and outer surface 12A for increasing the structural strength of facesheet 12, increasing the thermal conductivity between equipment 60 and heat pipes 22, 24 and 26, or both. The thermal resistance of the interface between equipment 60 and doubler 62 may be reduced further by applying a thermally conductive joint material 64 to the interface prior to assembly as described below. (Reducing thermal resistance is the same as increasing the thermal conductivity). A thermal control material such as black thermal paint 82 may be applied to the outer surface 12A of facesheet 12 in locations other than those at which equipment, such as equipment 60, are mounted. Outer surface 16A of outer facesheet 16 has predetermined thermal control characteristics that establish its performance as a thermal radiator surface. Control coating 86 may be either an optical solar reflector (OSR) or may be white paint, for example, as described in further detail below. Spacers 22B, 24B and 26B have a gap at the point where the spreader heat pipe 48 intersects header heat pipes 22, 24 and 26. Spreader heat pipe 48 includes a bore 48A, as shown in phantom behind honeycomb 14 of FIG. 4.

Figure 5:
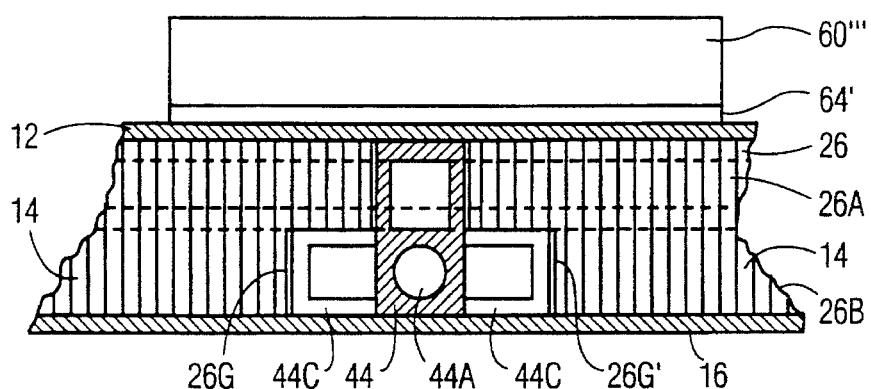

Improved thermal conductivity (i.e. reduced thermal resistance) at intersections between header heat pipes and spreader heat pipes is provided by enlarged areas such as 47C of heat pipe 47 or 44C of heat pipe 44 that may be employed to increase the area of thermal contact between heat pipes. Further detail of such intersection is shown in sectional view 5—5 of FIG. 5. Heat pipe 44 includes bore 44A containing the working fluid and a spacer 44B which may be integral to the case of heat pipe 44. Outer facesheet 16 is thermally bonded to spreader heat pipe 44 along its length and inner facesheet 12 is thermally bonded on its inner surface to spacer 44B. Honeycomb 14 fills the volume between inner facesheet 12 and outer facesheet 16 not containing heat pipes. Said another way, the core 14 is disposed in the spaces between facesheets 12 and 16 that are not occupied by the heat pipes of networks 20, 30 and 40. Extending to the left and right from opposite sides of spreader heat pipe 44 are spreader saddles 44C. Header heat pipe 26 is shown in phantom adjacent to inner facesheet 12 having bore 26A therethrough and spacer 26B integral therewith. Spacer 26B has a gap therein between edges 26G and 26G' into which the saddle 44C of spreader heat pipe 44 fits. The top of saddle 44C makes contact with the case of header heat pipe 26 thereby increasing the area of thermal contact and the thermal conductivity between said heat pipes at said intersection. Equipment 60''' shown in FIG. 5 may be a device dissipating a moderate amount of power so that it may be mounted to the inner facesheet 12 using a thermally conductive joint material 64 without a doubler.

Referring to FIG. 2, additional equipments 70, 70' mounted to inner facesheet 12 lie over an additional header 30 including heat pipes 32 and 34, for example. The number of heat pipes in a particular header and the number of headers employed determined by the arrangement and heat conduction requirements of the various equipments, 60, 60', 60'', 70 and 70'. Equipment 80 having a lower heat power dissipation and therefore requiring a lesser amount of heat to be conducted away, may be mounted at a convenient location on panel 10 as shown for low power equipment 80.

Headers 20 and 30 are preferably located in the central region of panel 10, i.e., a distance of at least one-fifth (⅕) of the working length "L" of heat pipes 42–48 (as shown in FIG. 2) away from the edges of panel 10. As a result thereof, the temperature of panel 10 will, to the extent it departs from the ideal of isothermal uniformity, tend to be slightly cooler (e.g. 10°–20° C.) at the edges than in the central region.

One known problem associated with heat pipes is that liquid "slugs" of the working fluid and noncondensable gases trapped within the bore of the heat pipe can interfere with the ability of the two-phase working fluid (whether in its liquid phase or its gaseous phase) to flow freely along the entire length of the heat pipe. When the working fluid is prevented from so flowing, the heat pipe is unable to conduct heat through the liquid slug or noncondensable gas accumulation and the heat conducting capacity of the heat pipe is drastically reduced.

This problem is avoided in the arrangement of FIG. 2 because each heat pipe has a short section at each end that is oriented to run along the edge of panel 10. Since panel 10 is rectangular and headers 20 and spreaders 40 intersect at 90° angles, the short sections of each heat pipe are bent about 90° with respect to the remainder of the heat pipe. The length of such short section is about two percent to ten percent (2%–10%) of the length L, and preferably is about five percent to seven percent (5%–7%) thereof. Because the short end sections of heat pipes 22–26 and of heat pipes 42–48 are along the edges of panel 10, they will tend to be slightly cooler (e.g., about 5° C.) than the remainder of such heat pipes. As a result of that temperature difference and the flow of gaseous phase working fluid toward the ends of the heat pipe, liquid slugs and noncondensable gas will tend to accumulate, if at all, in such short end sections where they do not materially affect the heat conduction capacity of the heat pipes over their working lengths L. It is satisfactory if the short end section is merely proximate the edge (e.g., within L/10 of the edge) and need not be right at the edge.

An optical solar reflector (OSR) is a thin transparent cover which is coated by a highly reflective material. Fused silica OSRs available from Optical Coating Laboratory, Inc. of Santa Rosa, Calif. are about 6 mils thick and are covered with a deposited silver coating on the side that is bonded to the panel and with an indium tin oxide conductive coating on the exposed surface. CMX glass OSRs available from Pilkington Space Technology of Bodelwyddan, Rhyl, Clwyd, United Kingdom, are about 3 mils thick and have a deposited silver coating on the side that is bonded to the panel and an indium tin oxide conductive coating on the surface exposed to space. Both are available in 1.65 inch by 1.65 inch squares and have solar absorptivity $\alpha$ of about 0.08 to 0.10 and thermal emissivity $\epsilon$ of about 0.78 to 0.81. The low ratio of absorptivity to emissivity $\alpha/\epsilon$ is indicative of the fact that the OSR is a very efficient radiator of thermal energy in the infrared band in which thermal energy is principally radiated and has a low thermal absorptivity in the band in which energy contained in solar illumination is found. Protection against discharge of plasma-induced electrostatic charge on the spacecraft is provided by the front to back surface resistance of about 200K$\Omega$ of the OSR in combination with the conductive indium oxide or indium tin oxide coatings on one surface thereof, the silver coating on the other surface thereof and their being affixed with adhesive that is not an electrical insulator, such as SOLITHANE® 113 adhesive (with carbon black filler) available from Morton-Thiokol, Inc., Morton Chemical Division of Chicago, Ill., or RTV 566 adhesive or a mixture of RTV 566 and RTV 567 adhesives (all with graphite fiber filler) available from General Electric Company of Waterford, N.Y.

Although it is desirable that the external coating material have an $\alpha$ as close to zero as possible and an $\epsilon$ as close to one as possible, the invention may be advantageously employed with substantially different values. For example, a coating with $\alpha \approx 0.4$ and $\epsilon \approx 0.6$, as might be obtained from a thermal control paint that has experienced degradation from exposure to ultraviolet (UV) and ionizing radiation, is operative because $\epsilon$ is substantially greater than $\alpha$.

The surface of interior facesheet 12 of panel 10 is covered with a thermal control paint, such as Chemglaze Z306 black paint or MH21S/LO black paint available from Lord Corporation of Erie, Penn. or from Illinois Institute of Technology Research of Chicago, Ill., respectively, except where equipment is mounted thereto. RTV 566 available from General Electric Company of Waterford, N.Y. or Eccosil 4952 available from Emerson & Cummings of Canton, Mass., may be used for enhancing thermal conductivity between the various items of equipment 60, 60', 70, 80, etc., and the inner facesheet 12.

In one embodiment, panel 10 is about 0.95 inches thick and employs 7 mil thick aluminum alloy inner and outer facesheets. An aluminum alloy foil honeycomb available from Hexcel Corporation located in Dublin, California is employed as the core of the panel to which the facesheets are bonded. Other panels may be thicker or thinner or employ heavier or lighter gauge facesheets (e.g., 5 mil to 10 mil) depending on whether the equipment mounted thereon has greater or lesser mass or higher or lower power dissipation. Similarly, thicker material or additional material, such as a doubler of 5–20 mil-thick aluminum, may be employed in regions of higher stress and/or higher power dissipation.

Each of the heat pipes described above is preferably an axially-grooved, constant-conductance, aluminum heat pipe employing an ammonia working fluid, of the type previously qualified and employed on many spacecraft such as ATS-II. These heat pipes are commercially available from OAO Corporation located in Greenbelt, Md., from Dynatherm Corporation located in Cockeysville, Md., and from Mitsubishi Electric Corporation located in Tokyo, Japan. The interior grooved bore of the aluminum heat pipe is generally circular in cross-section whereas the external walls thereof include at least one flattened portion for better making thermal contact with the facesheets 12 and 16 of panel 10 as well as with the other heat pipes with which they intersect and must transfer heat within such panel. Improved heat conduction at such intersections may be obtained by bonding the intersecting heat pipes to each other using a thermally-conductive epoxy or other adhesive, such as Eccobond 56C silver-loaded epoxy available from Emerson & Cummings located in Canton, Mass.

Although the foregoing describes a preferred embodiment of the invention, modifications thereto and variations will be apparent to one of ordinary skill in the art based on the descriptions and teachings herein. Applicant's invention includes such modifications and variations and is limited only by the scope of the claims below.

For example, spacers 22B, 24B and 26B are shown as separate pieces from heat pipes 22, 24 and 26 with which they are associated, but could be integral therewith such as by being commonly extruded with the casing of the heat pipe. Likewise, spacer 44B of FIG. 5 which is shown as being integral with the casing of heat pipe 44 could be a separate piece bonded or otherwise closely thermally coupled thereto. Further, spreader saddles 44C or 47C may be either integral with the heat pipe casing or may be separate pieces bonded or otherwise closely thermally coupled to the heat pipe. The spacers and saddles could be of cross-sections other than square or rectangular, as shown, such as a "I" or "T" cross-section. Such saddles for increasing conductivity could be employed on the header heat pipe, on the spreader heat pipe, or on both the header and spreader heat pipes.

While the integral heat pipe panel described above included aluminum alloy facesheets and honeycomb structural materials, they could be made of other suitable materials such as a KEVLAR® or carbon fiber composite material consistent with the requirements for structural strength and heat conduction. Structural material 14, described by way of example as being a honeycomb, may have its voids being in a square, rectangular, hexagonal or other convenient shape, or may be a cellular foam material.

What is claimed is:

1. A panel comprising:
   at least three elongated first heat conducting elements each having a high heat conductance along its length, said first heat conducting elements being closely spaced in side-by-side thermally-coupled relationship;
   at least three elongated second heat conducting elements each having a high heat conductance along its length, said second heat conducting elements being arrayed in spaced-apart, side-by-side relationship proximate to and angled to intersect said first heat conducting elements, said first heat conducting elements being substantially perpendicular to said second heat conducting elements at said intersection, each of said second heat conducting elements being proximate to and thermally coupled to said first heat conducting elements proximate said intersections;
   a first facesheet of a thermally conductive material having a first surface thermally coupled to each of said second heat conducting elements along the lengths thereof, said first facesheet having a second surface opposite its first surface;
   a thermal control material on said second surface of said first facesheet having a thermal emissivity that is substantially greater than its solar absorptivity; and
   a second facesheet of a thermally conductive material having a first surface thermally coupled to each of said first heat conducting elements along the lengths thereof and having a second surface for receiving thereon at predetermined locations overlying said first heat conducting elements a plurality of devices to be thermally controlled.

2. The panel of claim 1 wherein said first and second heat conducting elements are heat pipes.

3. The panel of claim 1 wherein at least one of said first and second heat conducting elements includes proximate its intersection with the other of said first and second heat conducting elements an enlarged portion of thermally conductive material for increasing the thermal conduction between said first and second heat conducting elements proximate said intersection.

4. The panel of claim 1 further comprising a material having a multiplicity of voids therein between and affixed to said first and second facesheets in spaces between said first and second facesheets not containing said first and second heat conducting elements.

5. The panel of claim 4 wherein said material having a multiplicity of voids therein includes a honeycomb having its ends bonded to the first surface of said first facesheet and to the first surface of said second facesheet.

6. The panel of claim 1 further comprising a thermal control material on the second surface of said second facesheet other than at said predetermined locations for receiving said devices to be thermally controlled.

7. The panel of claim 1 further comprising at least two elongated third heat conducting elements each having a high heat conductance along its length, wherein said third heat conducting elements are closely-spaced in side-by-side thermally-coupled relationship to each other between said first and second facesheets, are spaced apart from said first heat conducting elements, and are proximate to and angled to intersect said second heat conducting elements, wherein said third heat conducting elements are thermally coupled to said second heat conducting elements proximate said intersections therewith.

8. The panel of claim 1 wherein at least one of said second heat conducting elements includes at one of its ends a length thereof greater than two percent of its total length, wherein said length is angled to lie along an edge of said first facesheet.

9. A panel assembly comprising:
   a substantially planar inner facesheet adapted for receiving in predetermined locations on an outer surface thereof apparatus to be thermally controlled, wherein each of said apparatus generates heat at least some of the time, and having an inner surface;
   a substantially planar outer facesheet positioned in spaced-apart relation substantially parallel to said inner facesheet, an outer surface of said outer facesheet having predetermined thermal control characteristics and an inner surface thereof facing the inner surface of said inner facesheet;
   a first plurality of at least three elongated heat pipes closely spaced to each other in side-by-side thermally coupled relationship and affixed along their lengths in close thermal coupling to the inner surface of said inner facesheet underlying said predetermined locations on the outer surface thereof;

a second plurality of at least three elongated heat pipes in spaced-apart relationship and affixed along their lengths in close thermal coupling to the inner surface of said outer facesheet and intersecting the heat pipes of said first plurality of heat pipes, wherein the heat pipes of said first plurality of heat pipes are proximate to and substantially perpendicular to the heat pipes of said second plurality of heat pipes at said intersections;

means for closely thermally coupling each of the heat pipes of said second plurality of heat pipes to the heat pipes of said first plurality of heat pipes proximate said intersections; and a structural core formed of a material having a multiplicity of voids therein, wherein said core is disposed in spaces between said inner and outer facesheets not occupied by the heat pipes of the first and second plurality of heat pipes, said core having first and second spaced-apart ends affixed respectively to the inner surfaces of said inner and outer facesheets.

10. The panel assembly of claim 9 wherein said means for closely thermally coupling includes an enlarged region of at least one of the heat pipes of said second plurality of heat pipes, wherein said enlarged region is proximate the intersection with the heat pipes of said first plurality of heat pipes for increasing the area for thermal conduction between said one of the heat pipes of said second plurality of heat pipes and the heat pipes of the first plurality of heat pipes.

11. The panel assembly of claim 9 wherein said intersections are remote from the ends of the heat pipes of said second plurality of heat pipes by a distance greater than one-fifth of a working length of the heat pipes of said second plurality of heat pipes.

12. The panel assembly of claim 9 wherein at least one of the heat pipes of said second plurality of heat pipes includes at one of its ends a length greater than two percent of its total length that is angled to lie along an edge of said outer facesheet.

13. The panel assembly of claim 9 wherein said structural core includes a honeycomb structure having the ends thereof bonded to the inner surfaces of said inner and outer facesheets.

14. The panel assembly of claim 13 wherein said inner facesheet, said outer facesheet and said honeycomb structure are aluminum.

15. The panel assembly of claim 9 further comprising a thermal control material on the outer surface of said outer facesheet, said thermal control material having a thermal emissivity that is substantially greater than its solar absorptivity.

16. The panel assembly of claim 9 further comprising a plurality of thermally conductive spacers for thermally coupling the heat pipes of said first plurality of heat pipes to the inner surface of said outer facesheet.

17. The panel assembly of claim 9 further comprising a plurality of thermally conductive spacers for thermally coupling the heat pipes of said second plurality of heat pipes to the inner surface of said inner facesheet.

18. The panel assembly of claim 9 wherein at least one of the first and second pluralities of heat pipes includes heat pipes having a spacer integral therewith for thermally coupling said heat pipes to the inner surface of the other of said inner and outer facesheets from that to which said heat pipes are already closely thermally coupled according to claim 9.

19. A thermally conducting panel assembly comprising:

a substantially planar thin thermally-conductive inner facesheet;

at least three elongated first heat pipes closely spaced to each other in side-by-side relationship for being closely thermal coupled together, each of said elongated first heat pipes being affixed along its length in close thermal coupling to a first surface of said inner facesheet, said elongated first heat pipes being angled at their respective ends to lie proximate to and along opposite edges of said inner facesheet;

at least three elongated second heat pipes in spaced-apart substantially planar relationship and arranged to be proximate to and to intersect and thermally couple to each of said elongated first heat pipes, said elongated first heat pipes and said elongated second heat pipes being substantially straight and perpendicular to each other proximate said intersections, said elongated second heat pipes being angled proximate their ends;

a substantially planar thin thermally-coupled outer facesheet affixed on a first of its surfaces in close thermal coupling to each of said elongated second heat pipes, said outer face sheet having opposite edges lying proximate to and along the angled ends of said elongated second heat pipes;

a honeycomb core disposed in spaces between said inner and outer facesheets not occupied by ones of said first and second heat pipes, said honeycomb core having first and second spaced-apart ends affixed respectively to the first surfaces of said inner and outer facesheets;

a plurality of heat producing devices mounted to a second surface of said inner facesheet at locations overlying said elongated first heat pipes, each of said heat producing devices being closely thermally coupled to said inner facesheet;

a thermal control coating on the second surface of said inner facesheet other than at said locations to which said heat producing devices are mounted; and a thermal control material on a second surface of said outer facesheet, said thermal control material having a thermal emissivity that is substantially greater than its solar absorptivity.

* * * * *